United States Patent
Yamamoto

(10) Patent No.: US 6,851,081 B2
(45) Date of Patent: Feb. 1, 2005

(54) SEMICONDUCTOR MEMORY DEVICE HAVING ECC TYPE ERROR RECOVERY CIRCUIT

(75) Inventor: Kouji Yamamoto, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 443 days.

(21) Appl. No.: 09/910,915

(22) Filed: Jul. 24, 2001

(65) Prior Publication Data

US 2002/0013924 A1 Jan. 31, 2002

(30) Foreign Application Priority Data

Jul. 27, 2000 (JP) ........................................ 2000-227685

(51) Int. Cl.$^7$ ........................... G11C 29/00; H02H 3/05
(52) U.S. Cl. ......................................... 714/763; 714/6
(58) Field of Search ............................. 714/6, 763, 752

(56) References Cited

U.S. PATENT DOCUMENTS

| | | | | |
|---|---|---|---|---|
| 6,070,262 A | * | 5/2000 | Kellogg et al. | ............. 714/763 |
| 6,216,247 B1 | * | 4/2001 | Creta et al. | ................. 714/763 |
| 6,397,290 B1 | * | 5/2002 | Williams et al. | ........... 711/105 |

FOREIGN PATENT DOCUMENTS

| | | | |
|---|---|---|---|
| JP | 62-003498 | 1/1987 | ........... G11C/29/00 |
| JP | 2539950 | 7/1989 | |
| JP | 04-335300 | 11/1992 | |
| JP | 05-298895 | 11/1993 | |
| JP | 06-203596 | 7/1994 | |
| JP | 6-338199 | 12/1994 | |
| JP | 8-222639 | 8/1996 | |
| JP | 10-222995 | 8/1998 | ........... G11C/16/06 |
| JP | 10-326497 | 12/1998 | |

OTHER PUBLICATIONS

Japanese Office Action dated Dec. 18, 2003.
Partial English translation of Japanese Office Action dated Dec. 18, 2003.

* cited by examiner

*Primary Examiner*—Albert Decady
*Assistant Examiner*—Esaw Abraham
(74) *Attorney, Agent, or Firm*—McGinn & Gibb, PLLC

(57) ABSTRACT

A semiconductor memory device having an error check and correction (ECC) type error recovery circuit in which disposition of ECC cells is improved. The memory device comprises: a memory cell array including a plurality of normal cell array portions and an ECC cell array portion; an X decoder for selecting one of word lines in the memory cell array, the word lines extending from the X decoder to the memory cell array; an ECC operation circuit for performing error check and correction based on cell data read out from a selected word line, the cell data including data from normal cells and ECC cells of the selected word line. The ECC memory cell array portion is disposed at a location other than the far end of the word lines from the X decoder, that is, the ECC cell array portion is disposed at a location in which read out speed of data from ECC cell or cells does not become the worst speed in the memory device. Therefore, the worst data read out speed can be measured from outside.

20 Claims, 3 Drawing Sheets

PRIOR ART

WHEN ECC ENABLED:
TEST INPUT IS VCC → OUTPUT OF NAND1 DEPENDS ON ECC CELL DATA

WHEN ECC DISABLED:
TEST INPUT IS GND → OUTPUT OF NAND1 IS ALWAYS HIGH

PRIOR ART

SEMICONDUCTOR MEMORY DEVICE HAVING ECC TYPE ERROR RECOVERY CIRCUIT

FIELD OF THE INVENTION

The present invention relates generally to a semiconductor memory device, and more particularly to a semiconductor memory device having an error check and correction (ECC) type error recovery circuit in which disposition of ECC cells in a memory cell array is improved.

BACKGROUND OF THE INVENTION

According to an increase in memory capacity of a semiconductor memory device, it becomes indispensable to use an on-chip error recovery circuit which recovers or relieves error of defective memory cells. Typical error recovery circuits include a redundancy cell type error recovery circuit and an ECC type (or an ECC cell type) error recovery circuit.

The semiconductor memory device with a redundancy cell type error recovery circuit has normal memory cells and spare or redundant memory cells. When an address sent to a memory device is for a line, that is, a digit line or a word line, on which faulty cell or cells reside, the address decoder for the redundant line activates the redundant line in place of the line on which the faulty cell or cells reside. Thereby, the faulty cell or cells can be replaced by the spare memory cell or cells by the digit line or the word line, and data for the faulty cell or cells can be written into or read from the spare memory cell or cells. The redundancy cell type error recovery circuit is often used in a random access memory (RAM) type semiconductor memory device in which cell data can be written into the memory device after manufacturing the semiconductor memory device.

On the other hand, the semiconductor memory device with the ECC type error recovery circuit has normal memory cells for storing data bits and parity cells or ECC cells for storing check bits. In the ECC type error recovery circuit, check data stored in the ECC cells is previously adjusted by the ECC operation or ECC logic such that the result of exclusive OR operation (EOR), that is, ECC operation, of output data from the normal cells and output data from the ECC cells always becomes a previously determined value. For example, the previously determined value may be "1" in case of odd parity system or "0" in case of even parity system. The number of bits of the ECC cells is selected depending on the required error check and correction performance. When data is read out from the memory device, the ECC logic performs ECC operation to check the result of ECC operation. If the result of ECC operation becomes a value other than the previously determined value, the ECC logic corrects the faulty data and the ECC word as corrected is outputted, for example, to a processor. The ECC type error recovery circuit is often used in a read only memory (ROM) type semiconductor memory device in which cell data is written into the memory device when manufacturing the semiconductor memory device.

In this way, among these error recovery circuits, the redundancy cell type error recovery circuit is often used in a RAM device, and the ECC type error recovery circuit is often used in a ROM device. This is because, when the ECC type error recovery circuit is used in a RAM device, a circuit scale of the RAM device becomes very large. In the RAM device, the content of data written and stored in the normal cells may vary depending on the situation the RAM device is used. Therefore, it is necessary to use an operation circuit which changes the content of the ECC cells depending on the content of data in the normal cells.

On the other hand, when the redundancy cell type error recovery circuit is used in a ROM device, the chip size of the ROM device becomes large. In the ROM device, cell data is written into the ROM device during a manufacturing stage of the chip thereof. Therefore, in order for a memory manufacturer to ship memory devices in which all the defective cells are replaced by the redundancy cells, the redundancy cells for replacing the normal cells should have at least the same capacity as that of the normal cells. Therefore, the chip size becomes large.

In the conventional memory device which uses the ECC type error recovery circuit, there is a disadvantage as follows. That is, the conventional memory device having an ECC type error recovery circuit has a structure in which ECC cells are disposed at far end of word lines from an X decoder. In such conventional memory device, it is impossible to correctly measure from outside the worst value of reading out speed of cell data.

The reasons for this are as follows. First, with respect to memory devices such as ROM devices and the like which use the ECC type error recovery circuits, when the memory devices having various memory capacities are to be developed, the structure of each memory cell array unit is not changed but the number of memory cell array units is changed depending on the required memory capacities, in order to develop the memory devices in a short period. For example, memory capacities of memory devices to be developed are determined to be 128 Mbits, 64 Mbits, 32 Mbits and the like. In this case, a memory device having a memory capacity of 64 Mbits uses twice the number of memory cell array units of that of a memory device having a memory capacity of 32 Mbits. A memory device having a memory capacity of 128 Mbits uses twice the number of memory cell array units of that of a memory device having a memory capacity of 64 Mbits. Also, the peripheral circuits having the same circuit structure are commonly used for the memory devices having various memory capacities.

In such case, in a memory device having a relatively small memory capacity, the ECC type error recovery circuit is often omitted. This is because, in a memory device having a small memory capacity, a circuit area including memory cells and circuits which relate to an error recovery circuit becomes relatively large, when compared with a total chip area of the memory device. Therefore, when taking the number of effective pellets within a semiconductor wafer and the rate of error recovery by the ECC type error recovery circuit into consideration, a larger manufacturing yield is sometimes obtained when the ECC type error recovery circuit is not included in the memory chip, than when the ECC type error recovery circuit is included in the memory chip. Thus, in the conventional memory device, the ECC cells are disposed at the outermost portions of a memory cell array such that the ECC cells can be easily omitted from the memory cell array in a memory device which does not need the ECC cells. However, in recent memory devices, memory capacities have become larger than before, and, therefore, error recovery circuits such as the above-mentioned ECC type error recovery circuits have become essential for the memory devices. Therefore, the necessity of disposing the ECC cells at the outermost portion of the memory cell array becomes smaller than before.

In a memory device having an ECC type error recovery circuit, a read out speed of each memory cell is limited by a speed of a normal cell or an ECC cell which has lower read out speed. This is because, data read out from a normal cell and data read out from an ECC cell is operated and checked by an ECC operation circuit.

Also, a rising (or falling) time of a word select signal becomes slow at the far end portion of a word line when compared with that at the near end portion on the side of an X address decoder, and, therefore, a read out speed of cell data becomes slow at the far end portion of a word line.

FIG. 3 is a block diagram showing a schematic structure of a conventional memory device having an ECC type error recovery circuit. The memory device of FIG. 3 comprises a memory cell array 10c having a large number of memory cells (not shown in the drawing) which are disposed in a matrix and each of which is disposed at an intersection of a word line 6 and a digit line 8. The memory device of FIG. 3 further comprises an input circuit 1, a Y address decoder (or Y address decoding circuit: YDC) 2, an X address decoder (or X address decoding circuit: XDC) 3, an ECC operation circuit 4, sense amplifier blocks (SA) 5, and an output circuit 7.

The memory cell array 10c comprises normal cell array portions D0 and D1 and an ECC cell array portion P1. The ECC cell array portion P1 is disposed at the far end portion from the X decoder 3. The input circuit 1 comprises, for example, a plurality of buffer circuits, and receives input address data signals specifying memory cells from which data is to be retrieved. The input address data signals are divided into X address data signals and Y address data signals which are supplied to the X decoder 3 and Y decoder 2, respectively. The X address decoder 3 decodes the X address data signal supplied from the input circuit 1, and produces a word line selecting signal which is supplied to a selected word line. The Y address decoder 2 decodes the Y address data signal supplied from the input circuit 1, and produces digit line selecting signals for selecting digit lines. An ECC operation circuit 4 includes logic circuits such as exclusive OR circuits and the like, and performs error check and correction as known in the art.

In the memory device shown in FIG. 3, when a word line 6 is selected by the X decoder 3 and memory cells, for example, B, C and A, of normal cell array portions D0 and D1 and an ECC cell array portion P1 are selected by the Y decoder 2, a time required until a cell is selected becomes long as the location of the selected cell becomes far from the X address decoder 3. Therefore, in FIG. 3, the time required for selecting the cell A, that is, an ECC cell, and for sending data of the selected cell A to the ECC operating circuit 4 becomes longer than the time required for selecting each of the cells B and C, that is, each normal cell, and for sending data of each of the selected cells B and C to the ECC operating circuit 4. Thus, the time the data from the selected word is outputted is determined or limited by the time the data is outputted from the memory cell A, that is, the ECC cell.

Also, in case the read out speed of cell data is to be inspected or measured, it is possible to measure the read out speed of the normal cells by disabling the ECC error recovery circuit. However, it is impossible to measure the read out speed of the ECC cells. This is because, it is usually impossible to output cell data from the ECC cells. Also, data stored in the ECC cells corresponds to an operation result determined depending on the contents of the normal cells. Therefore, it is impossible to easily know or determine the content of data of the ECC cells from outside.

That is, when the ECC cells are disposed at far end portions of word lines, it is impossible to measure the worst data read out speed of a memory device, in order to perform production test of memory devices, to analyze the cause of a defect in operation speed and the like.

FIG. 4 is a block diagram showing another example of a conventional memory device having an ECC type error recovery circuit. The memory device of FIG. 4 comprises a memory cell array 10d having a large number of normal memory cells (not shown in the drawing) which are disposed in a matrix and each of which is disposed at an intersection of a word line 6 and a digit line not shown in the drawing. That is, the memory cell array 10d comprises normal cell array portions D0 and D1. The memory device of FIG. 4 also comprises a memory cell array 10e which is composed of an ECC cell array portion P1. The memory device of FIG. 3 further comprises an input circuit 1, Y address decoders (YDC) 2a and 2b, X address decoders (XDC) 3a and 3b, an ECC operation circuit 4, sense amplifier blocks (SA) 5, and an output circuit 7. The X address decoders 3a and 3b may have the same structure.

The input circuit 1 comprises, for example, a plurality of buffer circuits, and receives input address data signals specifying memory cells from which data is to be retrieved. The input address data signals are divided into X address data signals and Y address data signals which are supplied to the X address decoders 3a and 3b and Y address decoders 2a and 2b, respectively. The X address decoders 3a and 3b decodes the X address data signal supplied from the input circuit 1, and produces word line selecting signals each of which is supplied to a selected word line of the normal memory cell array 10d and the ECC memory cell array 10e. The Y address decoders 2a and 2b decode the Y address data signal supplied from the input circuit 1, and produce digit line selecting signals for selecting digit lines in the normal memory cell array 10d and the ECC memory cell array 10e. An ECC operation circuit 4 includes logic circuits such as exclusive OR circuits and the like, and performs error checking and correction as known in the art.

In the memory device shown in FIG. 4, a word line 6 in the normal memory cell array 10d is selected by the X decoder 3a and a corresponding word line (not shown in the drawing) in the ECC memory cell array 10e is selected by the X decoder 3b. Also, memory cells in the selected word line of the normal cell array 10d and memory cells in the selected word line of the ECC cell array 10e are selected by the Y decoders 2a and 2b, respectively. Thereby, data of the selected cells in the normal memory cell array portions D0 and D1 and data of the selected cells in the ECC memory cell array portion P1 are sent to the ECC operating circuit 4. The ECC operating circuit 4 performs error check and correction based on the data from the selected cells in the normal memory cell array portions D0 and D1 and the data from the selected cells, that is, ECC cells, in the ECC memory cell array portion P1, and produces corrected read out data which is supplied to outside via the output circuit 7.

In the memory device shown in FIG. 4, the ECC cell array portion P1 and the normal cell array portions D0 and D1 are provided as separate memory cell arrays, and operation of these cell array portions is independently performed. Therefore, a read out speed of cell data becomes slowest at a cell disposed at the far end portion of a word line, that is, at a normal memory cell disposed at the far end portion of a word line in the normal memory cell array 10d. Thus, it is possible to measure the worst read out speed of cell data.

However, as apparent from FIG. 4, this memory structure requires at least twice the number of word lines and the X address decoders to select the normal memory cells and the ECC memory cells. Therefore, a circuit scale of peripheral circuits becomes large and a chip size of the memory device becomes large.

FIG. 5 shows a conventional circuit including an ECC operation circuit 4 and a logic circuit for enabling and/or disabling the ECC error recovery. The circuit shown in FIG. 5 includes a NAND logic circuit NAND1 which receives an output data bit from a sense amplifier SA for ECC cell and a test enable signal from a test input terminal. The output of the NAND logic circuit NAND1 and an output of a sense amplifier SA for normal cell are both supplied to the ECC operation circuit 4 to perform error checking and correction.

In the circuit shown in FIG. 5, when the ECC error recovery is to be enabled, the test enable signal at the test input terminal is driven to a logically high potential, for example, to a power supply voltage VCC. Therefore, the output of the NAND1 depends on the output of the sense amplifier SA for ECC cell and is supplied to the ECC operation circuit 4, so that ECC error recovery operation can be performed. On the other hand, when the ECC error recovery is to be disabled, the test enable signal at the test input terminal is driven to a logically low potential, for example, to the ground. Therefore, the output of the NAND1 always becomes logically high, so that ECC error recovery operation is disabled and only normal cell data from the sense amplifier SA for normal cell is read out via the ECC operation circuit 4.

That is, in the circuit shown in FIG. 5, when the ECC error recovery is disabled, it is possible to read out the data from normal cells without being influenced by ECC cells and to measure the read out speed of the normal cell data from outside. However, the data of the ECC cells are used only for ECC operation and can not be outputted to outside. Therefore, it is impossible to measure the read out speed of the ECC cell data from outside. Although it is possible to build in a memory device an additional circuit for outputting the ECC cell data to outside, the circuit scale of such memory device becomes large.

In summary, in the conventional memory device having an ECC type error recovery circuit, when the ECC cells are disposed at far end portions of word lines, it is impossible to measure the worst data read out speed of a memory device, in order to perform production test of memory devices, to analyze the cause of a defect in operation speed and the like. This is because, it is impossible to read the ECC cell data from outside. When an additional circuit is built in a memory device for outputting ECC cell data to outside, the circuit scale of such memory device becomes too large.

SUMMARY OF THE INVENTION

Therefore, it is an object of the present invention to obviate the disadvantages of the conventional semiconductor memory device having an ECC type error recovery circuit.

It is another object of the present invention to provide a semiconductor memory device having an ECC type error recovery circuit in which the worst reading out speed of cell data can be easily measured form outside.

It is another object of the present invention to provide a semiconductor memory device having an ECC type error recovery circuit in which data can be easily read out from a memory cell having the worst reading out speed.

It is still another object of the present invention to provide a semiconductor memory device having an ECC type error recovery circuit in which a reading out speed of an ECC cell does not become the worst reading out speed of the semiconductor memory device.

According to an aspect of the present invention, there is provided a semiconductor memory device having an error check and correction (ECC) type error recovery circuit comprising: a memory cell array including at least one normal memory cell array portion and an ECC memory cell array portion, said normal memory cell array portion including a plurality of normal memory cells, and said ECC memory cell array portion including a plurality of ECC memory cells; an X decoder for selecting one of word lines in the memory cell array, the word lines extending from the X decoder to the memory cell array; and an ECC operation circuit for performing error check and correction based on cell data read out from a selected word line, the cell data including data from normal cells and ECC cells of the selected word line; wherein the ECC memory cell array portion is disposed at a location other than the far end of the word lines from the X decoder.

In this case, it is preferable that the ECC memory cell array portion is disposed at a middle portion of the memory cell array.

It is also preferable that the ECC memory cell array portion is disposed approximately at the central portion of the memory cell array.

It is further preferable that the ECC memory cell array portion is disposed at the near end of the word lines on the side of the X decoder.

It is advantageous that the at least one normal memory cell array portion comprises a plurality of normal memory cell array portions.

It is also advantageous that the semiconductor memory device further comprises a Y decoder and digit lines extending from the Y decoder toward the memory cell array.

It is further advantageous that the cell data is supplied to the ECC operation circuit via sense amplifiers.

It is preferable that the semiconductor memory device is a random access memory (RAM) device.

It is also preferable that the semiconductor memory device is a read-only memory (ROM) device.

It is further preferable that data read out from the normal memory cell array portions can be outputted to outside of the semiconductor memory device without undergoing ECC operation by the ECC operation circuit.

According to another aspect of the present invention, there is provided a semiconductor memory device having an error check and correction (ECC) type error recovery circuit comprising: a memory cell array including a plurality of normal memory cell array portions and an ECC memory cell array portion, each of the normal memory cell array portions including a plurality of normal memory cells, and the ECC memory cell array portion including a plurality of ECC memory cells; an X decoder for selecting one of word lines in the memory cell array, the word lines extending from the X decoder to the memory cell array; a Y decoder and digit lines extending from the Y decoder toward the memory cell array; an ECC operation circuit for performing error check and correction based on cell data read out from a selected word line, the cell data including data from normal cells and ECC cells of the selected word line; wherein the ECC memory cell array portion is disposed at a location other than the far end of the word lines from the X decoder.

In this case, it is preferable that the ECC memory cell array portion is disposed at a middle portion of the memory cell array.

It is also preferable that the ECC memory cell array portion is disposed approximately at the central portion of the memory cell array.

It is further preferable that the ECC memory cell array portion is disposed at a near end of the word lines on the side of the X decoder.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, embodiments of the present invention will be described in detail.

Figure 1:
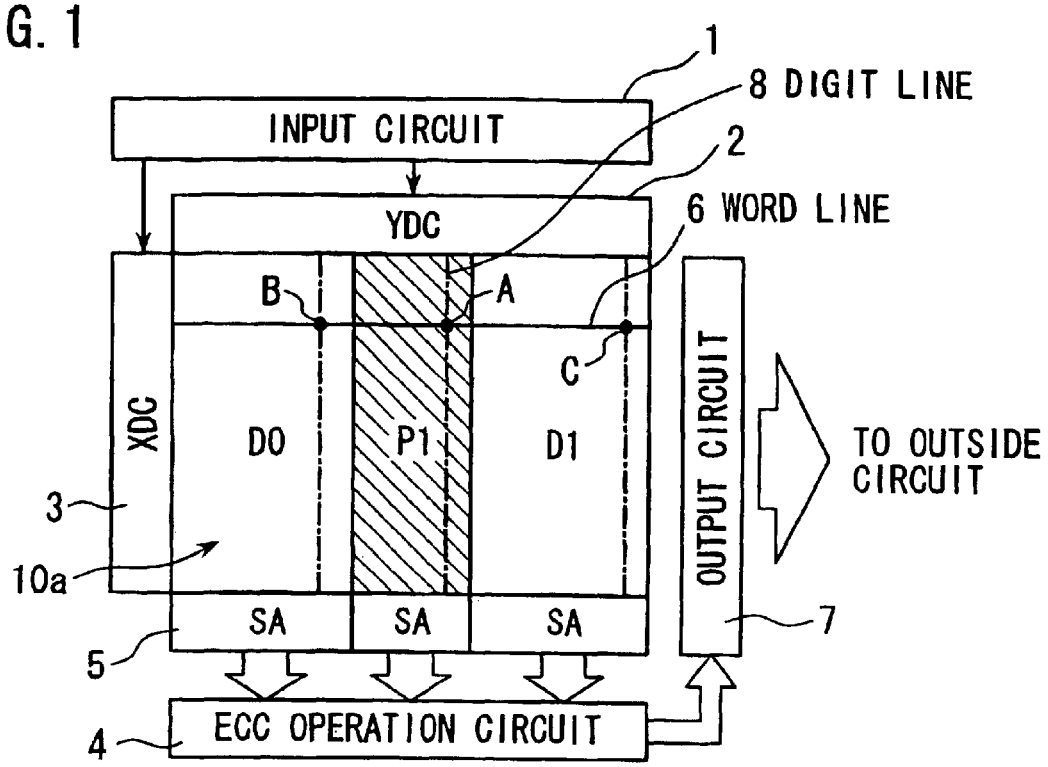
FIG. 1 is a block diagram showing a schematic structure of a memory device having an ECC type error recovery circuit according to an embodiment of the present invention.

FIG. 1 is a layout diagram showing a structure of a memory device having an ECC type error recovery circuit according to an embodiment of the present invention. The memory device of FIG. 1 comprises a memory cell array 10*a* having a large number of memory cells (not shown in the drawing) which are disposed in a matrix and each of which is disposed at an intersection of a word line 6 and a digit line 8. The memory device of FIG. 1 further comprises an input circuit 1, a Y address decoder (or Y address decoding circuit: YDC) 2, an X address decoder (or X address decoding circuit: XDC) 3, an ECC operation circuit 4, sense amplifier blocks (SA) 5, and an output circuit 7.

The memory cell array 10*a* comprises normal cell array portions D0 and D1 and an ECC cell array portion P1. In FIG. 1, only two normal memory cell array portions D0 and D1 are shown. However, the number of the normal cell array portions can be, for example, 16, that is, there can be 16 normal cell array portions D0–D15. In such case, 16 digit lines extend from the Y decoder 2 to the normal cell array portions D0–D15. Also, the number of bits of each ECC word, that is, the number of digit lines extending from the Y decoder 2 to the ECC cell array portion P1 may be any number depending on the required error recovery performance.

Figure 3:
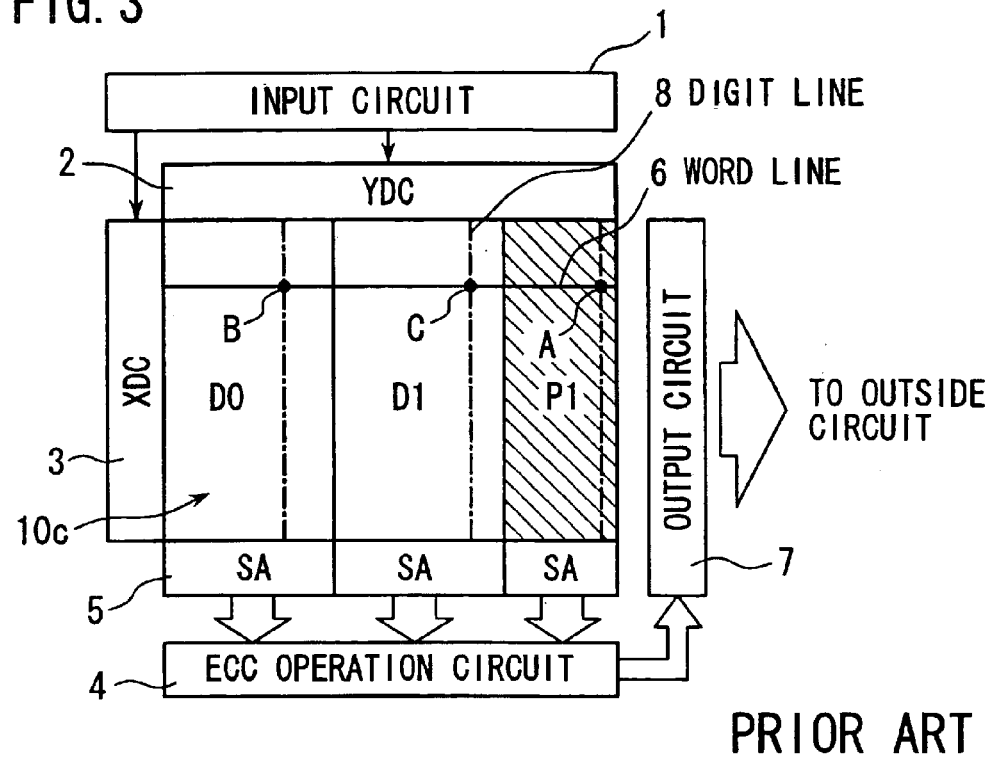
FIG. 3 is a block diagram showing a schematic structure of a conventional memory device having an ECC type error recovery circuit.
Figure 4:
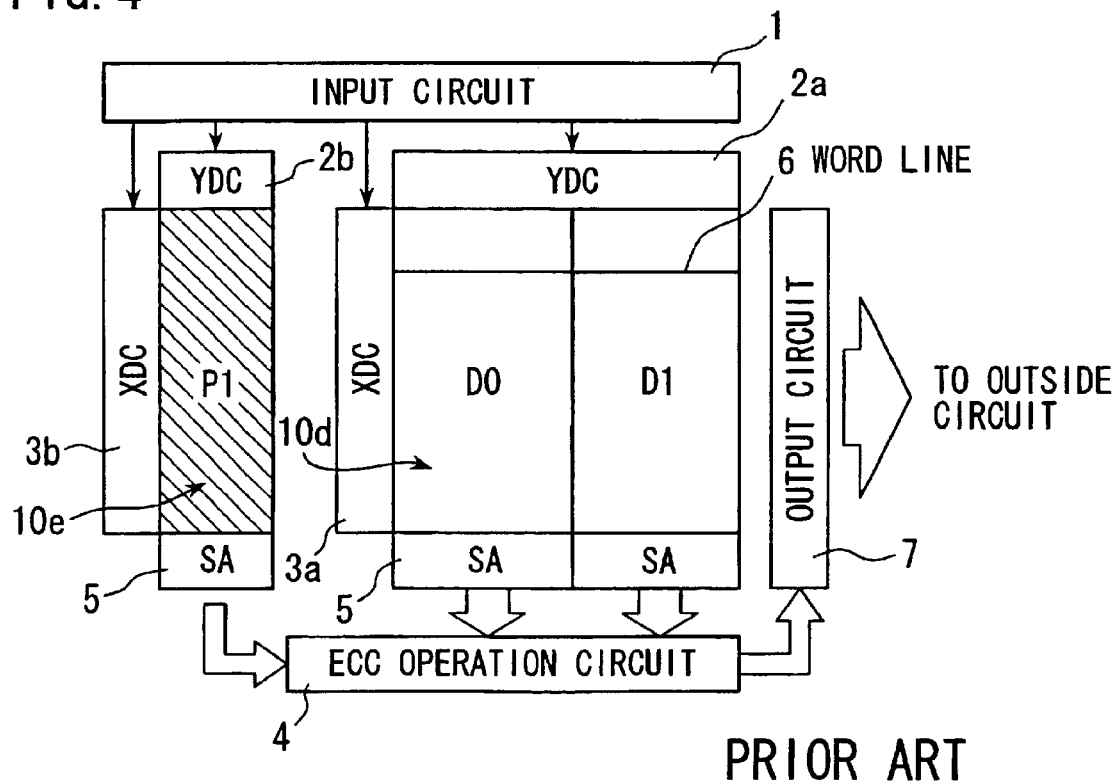
FIG. 4 is a block diagram showing another example of a conventional memory device having an ECC type error recovery circuit.

It should be noted that, in the present invention, the ECC cell array portion P1 is not disposed at the far end portion of the word lines 6 from the X decoder 3 like the memory device shown in FIG. 3. In this embodiment, the ECC cell array portion P1 is disposed at a middle portion in the memory cell array 10*a*, that is, between the normal cell array portions D0 and D1.

The input circuit 1 comprises, for example, a plurality of buffer circuits, and receives input address data signals specifying memory cells, for example, a word, from which data is to be retrieved. The input address data signals are divided into X address data signals and Y address data signals which are supplied to the X decoder 3 and Y decoder 2, respectively. The X address decoder 3 decodes the X address data signal supplied from the input circuit 1, and produces a word line selecting signal which is supplied to a selected word line in the memory cell array 10*a*. The Y address decoder 2 decodes the Y address data signal supplied from the input circuit 1, and produces digit line selecting signals for selecting digit lines. An ECC operation circuit 4 includes logic circuits such as exclusive OR circuits and the like, and performs error checking and correction as known in the art.

In the memory device shown in FIG. 1, an input address data is supplied to the input circuit 1, and corresponding X address data and Y address data are inputted to the X decoder 3 and the Y decoder 2, respectively. A word line 6 is selected by the X decoder 3, and memory cells of the normal cell array portions D0 and D1 and the ECC cell array portion P1 are selected by the Y decoder 2. Thereby, data of memory cells at intersections between the selected word line 6 and a plurality of digit lines 8 are outputted via the sense amplifier blocks SA to the ECC operation circuit 4. The ECC operation circuit 4 performs error check and correction by using data read out from memory cells of the ECC memory cell array portion P1, that is, data read out from ECC cells. The ECC cells may store data bits necessary for error check and correction. The ECC cells may be parity bit or bits, data bits for Hamming code and the like. The type and the number of bits of the ECC cells may depend on how many bit or bits of normal cells are to be error checked and corrected. For example, when parity check system is used, it is possible to detect one bit error of normal cell per one word line. By using Hamming code, it is possible to check and correct, for example, one bit error of normal cell per one word line. In this way, the ECC operation circuit 4 corrects erroneous bit into a correct expected value, and the corrected read out data is outputted to outside via the output circuit 7.

Figure 2:
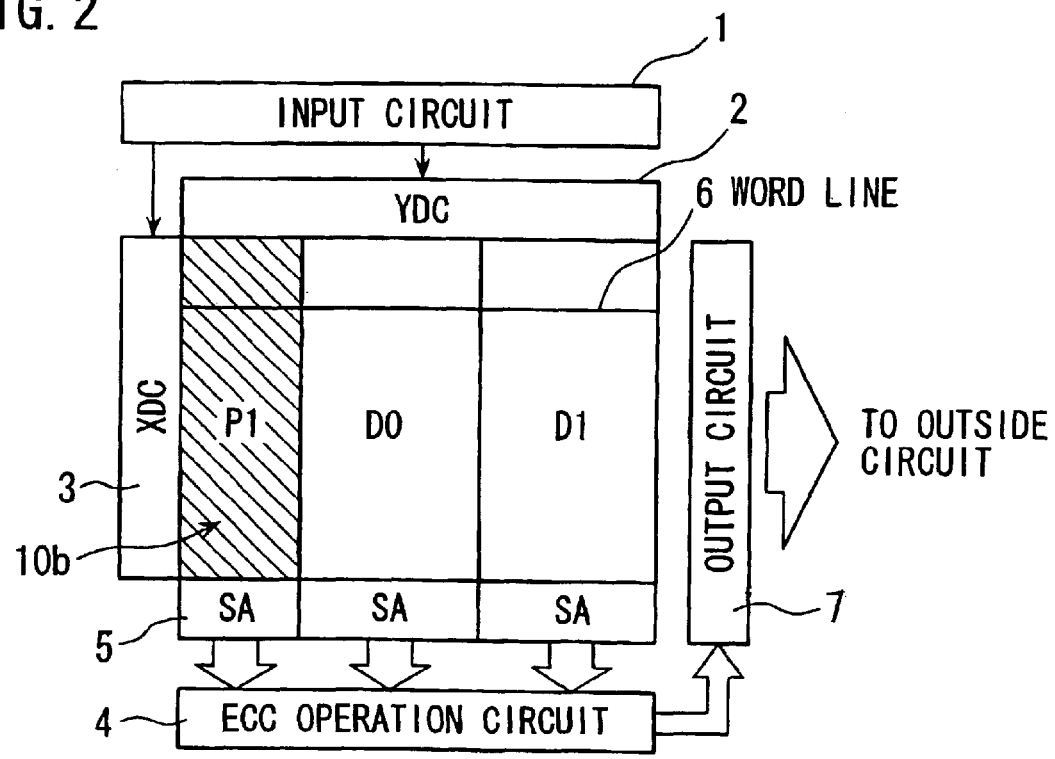
FIG. 2 is a block diagram showing a schematic structure of a memory device having an ECC type error recovery circuit according to another embodiment of the present invention.

FIG. 2 is a layout diagram showing a structure of a memory device having an ECC type error recovery circuit according to another embodiment of the present invention. The memory device of FIG. 2 differs from the memory device of FIG. 1, in that, in the memory device of FIG. 2, the ECC cell array portion P1 is disposed at the near end of the word lines with respect to the X decoder 3, that is, at the side of the X decoder 3. The other portions of the memory device of FIG. 2 may be the same as the memory device of FIG. 1.

As mentioned above, in the present invention, the ECC cell array portion P1 is disposed at a portion other than the far end or farthest end of the word lines 6 from the X decoder 3. For example, in the structure of FIG. 1, the ECC cell array portion P1 is disposed at a middle portion between the normal cell array portions D0 and D1. In the structure of FIG. 2, the ECC cell array portion P1 is disposed at the near end of the word lines with respect to the X decoder 3, that is, at the side of the X decoder 3.

As mentioned before, a time required until a cell is selected becomes long as the location of the selected cell becomes far from the X address decoder 3. Therefore, for example, in FIG. 1, the time required for selecting the cell C, that is, a normal cell, and for sending data of the selected cell C to the ECC operating circuit 4 becomes longer than the time required for selecting each of the cells A and B, that is, an ECC cell and another normal cell, and for sending data of each of the selected cells A and B to the ECC operating circuit 4. Thus, the time the data from the selected word is outputted is limited by the time the data is outputted from the memory cell C, that is, the normal cell.

That is, the ECC cell array portion P1 is disposed at a location in which read out speed of data from ECC cell or cells does not become the worst speed or the slowest speed in a memory device. In other words, the ECC cell array portion P1 is disposed at a location other than at the far end portion of the word lines, with respect to the X decoder 3. Thereby, in the structures of FIGS. 1 and 2, the normal cell array portion D1 is disposed at a location in which read out speed of data from normal cell or cells becomes the worst speed in a memory device. Therefore, the worst read out speed of data can be measured from outside, in order to perform production test of memory devices, to analyze the cause of defect in operation speed and the like.

Also, in the structure of FIG. 1, the ECC cell array portion P1 is disposed approximately in the central portion of the memory cell array 10a. In such structure, in addition to the above-mentioned advantageous effect of the invention, it is possible to improve the manufacturing yield of semiconductor memory devices because of an improvement in an error recovery rate. This is because, the process margin of memory cells in the middle or central portion of the memory cell array is larger than that of memory cells in the peripheral portion of the memory cell array, and the probability that a memory cell in the middle or central portion of the memory cell array becomes defective is lower than the probability that a memory cell in the peripheral portion of the memory cell array becomes defective. Therefore, defects in ECC cells are decreased, and defects in normal cells can be surely recovered. That is, a rate of error recovery of normal cells becomes large.

Figure 5:
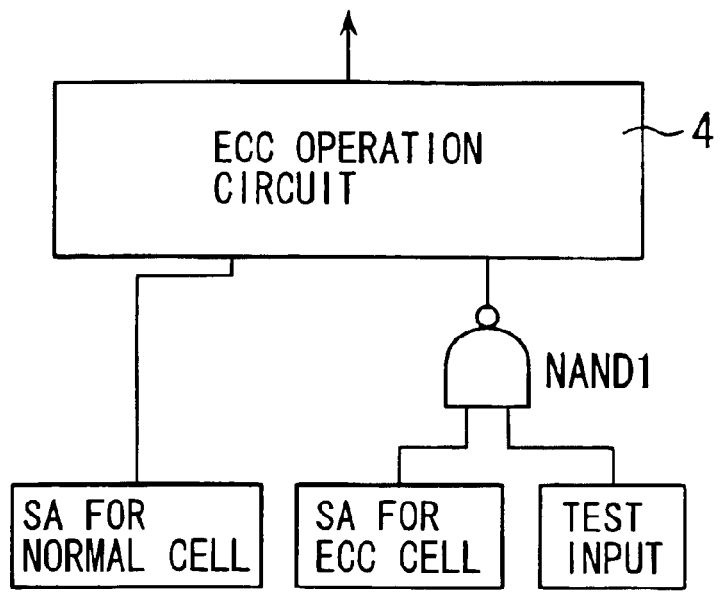
FIG. 5 is a block circuit diagram showing a circuit including an ECC operation circuit and a logic circuit for enabling and/or disabling the ECC error recovery.

In the present invention, it is also preferable to use a circuit like that shown in FIG. 5 which disables ECC operation when reading out data from normal cells. It is also possible to provide a circuit by which read out data, for example, from normal cells can be outputted to outside without passing through the ECC operation circuit 4 under the control of a bypass control signal and the like. Such circuit can be easily implemented by using logic gates and the like. By using such circuit, it is possible to confirm the advantageous effect of the present invention.

The present invention is applicable to a RAM device having RAM cells, a ROM device having ROM cells and the like.

In summary, according to the present invention, the ECC cell array portion P1 is disposed at a portion other than the far end portion of the word lines 6 from the X decoder 3. In the structure of FIG. 1, the ECC cell array portion P1 is disposed at a middle portion between the normal cell array portions D0 and D1. In the structure of FIG. 2, the ECC cell array portion P1 is disposed at the near end of the word lines with respect to the X decoder 3, that is, between the X decoder 3 and the normal cell array portions D0 and D1. By such dispositions, it is possible to prevent the ECC cell array portion P1 from being disposed at a location in which read out speed of ECC cell becomes the worst speed in a memory device. Therefore, the worst read out speed of data of a memory device having an ECC type error recovery circuit can be easily measured from outside.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor memory device having an error check and correction (ECC) type error recovery circuit comprising:
    a memory cell array including at least one normal memory cell array portion and an ECC memory cell array portion, said normal memory cell array portion including a plurality of normal memory cells, and said BCC memory cell array portion including a plurality of ECO memory cells;
    an X decoder for selecting one of word lines in said memory cell array, said word lines extending from said X decoder to said memory cell array; and
    an ECC operation circuit for performing error check and correction based on cell data read out from a selected word line, said cell data including data from normal cells and ECC cells of said selected word line;
    wherein said ECC memory cell array portion is disposed at a location other than the far end of said word lines from said X decoder.

2. A semiconductor memory device as set forth in claim 1, wherein said ECC memory cell array portion is disposed at the near end of said word lines on the side of said X decoder.

3. A semiconductor memory device as set forth in claim 1, wherein said at least one normal memory cell array portion comprises a plurality of normal memory cell array portions.

4. A semiconductor memory device as set forth in claim 1, further comprising a Y decoder and digit lines extending from said Y decoder toward said memory cell array.

5. A semiconductor memory device as set forth in claim 1, wherein said cell data is supplied to said ECC operation circuit via sense amplifiers.

6. A semiconductor memory device as set forth in claim 1, wherein said semiconductor memory device comprises a random access memory (RAM) device.

7. A semiconductor memory device as set forth in claim 1, wherein said semiconductor memory device comprises a read-only memory (ROM) device.

8. A semiconductor memory device as set forth in claim 1, wherein data read out from said normal memory cell array portions can be outputted to outside of said semiconductor memory device without undergoing ECC operation by said ECC operation circuit.

9. A semiconductor memory device as set forth in claim 1, wherein sad ECC memory cell array portion is disposed at a location other than the far end and a near end of said word lines from said X decoder.

10. A semiconductor memory device as set forth in claim 1, wherein sad ECC memory cell array portion is disposed at a location on said word lines between locations of at least two of the plurality of normal memory cells on said word lines.

11. A semiconductor memory device as set forth in claim 1, wherein a read out speed of data from said ECC memory cells in said ECC memory cell array portion is less than a read out speed of at least one of the plurality of normal memory cells in said normal memory cell array.

12. A semiconductor memory device having an error check and correction (ECC) type error recovery circuit comprising:
    a memory cell array including at least one normal memory cell array portion and an ECC memory cell array portion, said normal memory cell array portion including a plurality of normal memory cells, and said ECC memory cell array portion including a plurality of ECC memory cells;

an X decoder for selecting one of word lines in said memory cell array, said word lines extending from said X decoder to said memory cell array; and an ECC operation circuit for performing error check and correction based on cell data read out from a selected word line, said cell data including data from normal cells and ECC cells of said selected word line;

wherein said ECC memory cell array portion is disposed at a location other than the far end of said word lines from said X decoder, and wherein said ECC memory cell array portion is disposed at a middle portion of said memory cell array.

13. A semiconductor memory device having an error check and correction (ECC) type error recovery circuit comprising:

a memory cell array including at least one normal memory cell array portion and an ECC memory cell array portion, said normal memory cell array portion including a plurality of normal memory cells, and said ECC memory cell array portion including a plurality of ECC memory cells;

an X decoder for selecting one of word lines in said memory cell array, said word lines extending from said X decoder to said memory cell array; and an ECC operation circuit for performing error check and correction based on cell data read out from a selected word line, said cell data including data from normal cells and ECC cells of said selected word line;

wherein said ECC memory cell array portion is disposed at a location other than the far end of said word lines from said X decoder, and wherein said ECC memory cell array portion is disposed substantially the central portion of said memory cell array.

14. A semiconductor memory device having an error check and correction (ECC) type error recovery circuit comprising:

a memory cell array including a plurality of normal memory cell array portions and an ECC memory cell array portion, each of said normal memory cell array portions including a plurality of normal memory cells, and said ECC memory cell array portion including a plurality of ECC memory cells;

an X decoder for selecting one of word lines in said memory cell array, said word lines in said memory cell array, said word lines extending from said X decoder to said memory cell array;

a Y decoder and digit lines extending from said Y decoder toward said memory cell array;

an ECC operation circuit for performing error check and correction based on cell data read out from a selected word line, said cell data including data from normal cells and ECC cells of said selected word line;

wherein said ECC memory cell array portion is disposed at a location other than the far end of said word lines from said X decoder.

15. A semiconductor memory device as set forth in claim 14, wherein said ECC memory cell array portion is disposed at a middle portion of said memory cell array.

16. A semiconductor memory device as set forth in claim 14, wherein said ECC memory cell array portion is disposed substantially at the central portion of said memory cell array.

17. A semiconductor memory device as set forth in claim 14, wherein said ECC memory cell array portion is disposed at a near end of said word lines on the side of said X decoder.

18. A semiconductor memory device as set forth in claim 14, wherein a selection time of said ECC memory cells in said ECC memory cell array portion is less than a selection time of at least one of the plurality of normal memory cells in said normal memory cell array.

19. A semiconductor memory device as set forth in claim 14, wherein said ECC memory cell array portion is disposed at a location on said word lines for limiting a time for selecting said ECC memory cells in said ECC memory cell array portion to a time that is less than a time for selecting at least one of the plurality of normal memory cells in said normal memory cell array.

20. A semiconductor memory device as set forth in claim 14, wherein said ECC memory cell array portion is disposed at a location on said word lines for limiting a read out speed of data from said ECC memory cells in said ECC memory cell array portion to a read out speed that is less than a read out speed of at least one of the plurality of normal memory cells in said normal memory cell array.

* * * * *